United States Patent [19]

Bockelman

[11] Patent Number: 5,734,268
[45] Date of Patent: Mar. 31, 1998

[54] CALIBRATION AND MEASURMENT TECHNIQUE AND APPARATUS FOR SAME

[75] Inventor: David E. Bockelman, Plantation, Fla.

[73] Assignee: Motorola, Inc., Schaumburg, Ill.

[21] Appl. No.: 628,066

[22] Filed: Apr. 8, 1996

[51] Int. Cl.⁶ .................................................. G01R 35/00
[52] U.S. Cl. ............................................ 324/601; 324/628
[58] Field of Search ............................... 324/601, 628, 324/661, 684, 720

[56] References Cited

U.S. PATENT DOCUMENTS

| | | | |
|---|---|---|---|
| 4,488,813 | 12/1984 | Kissinger et al. | 356/375 |
| 4,697,143 | 9/1987 | Lockwood et al. | 324/754 |
| 4,764,723 | 8/1988 | Strid | 324/765 |
| 4,827,211 | 5/1989 | Strid et al. | 324/754 |
| 4,831,497 | 5/1989 | Webster et al. | 361/774 |
| 4,871,964 | 10/1989 | Boll et al. | 324/754 |
| 4,894,612 | 1/1990 | Drake et al. | 324/754 |
| 5,354,413 | 10/1994 | Smesny et al. | 156/627 |
| 5,376,902 | 12/1994 | Bockelman et al. | 333/5 |
| 5,382,911 | 1/1995 | Cotler et al. | 324/662 |
| 5,502,391 | 3/1996 | Sciacero et al. | 324/628 |

OTHER PUBLICATIONS

Butler, J.V., Rytting, D.K., Iskander, M.F., Pollard, R.D., Vanden M., "16–Term Error Model and Calibration Procedure for On–Wafer Network Analysis Measurements," Techniques, IEEE, vol. 39, No. 12, Dec. 1991, pp. 2211–2217.
Carlton, D.E., Gleason, K.R. and Strid, E.W., "Microwave Wafer Probing," Microwave Journal, Jan. 1985.
Product Note 8510–8, Network Analysis, "Applying the HP 8510B TRL Calibration for Non–Coaxial Measurements," Hewlett–Packard Oct. 1, 1987, U.S.A., 5954–8382.

*Primary Examiner*—Glenn W. Brown
*Attorney, Agent, or Firm*—Barbara R. Doutre

[57] ABSTRACT

A network analyzer system employs a calibration and measurement technique (300) to compensate for probe tip crosstalk. Calibration technique (310) calibrates standards (400, 500, 600) having variable probe separations. Error terms are produced for each separation. Continuous functions (702, 704, 706) are developed for the error terms as a function of distance. A device under test (802) can then be measured and a set of error terms is generated based on the separation between the probes. These error terms (902) are then used to correct the measurement of the device under test (802). A device under test (802) can thus be measured with various probe tip separations and differing impedances without having to re-calibrate the network analyzer.

26 Claims, 9 Drawing Sheets

CALIBRATION AND MEASURMENT TECHNIQUE AND APPARATUS FOR SAME

TECHNICAL FIELD

This invention relates in general to measurement systems and more particularly to network analyzer measurement systems.

BACKGROUND

Network analyzers are widely used in radio frequency (RF) and microwave applications for the measurement of a circuit's unknown scattering parameters (S-parameters). Since network analyzers are non-ideal, the measurements made with network analyzers have errors. These errors can be grouped into two major categories: systematic and non-systematic. Systematic errors include all static (repeatable) errors, and non-systematic errors include noise, drift, and other time variant errors.

Theoretically, any static systematic errors can be corrected. This process, called calibration, involves measuring certain well known devices, called standards, with the non-ideal network analyzer. With proper application, these raw measurements can be used to solve for all systematic errors. After calibration, the systematic network analyzer errors can be removed from the measurements of any unknown device; this is called error correction. The error correction process will yield valid results only if the network analyzer remains static. Even small changes in the network analyzer such as disconnecting and reconnecting cables, can result in much degraded accuracy in the correction process.

When network analyzers are used to make on-wafer measurements, one type of pseudo systematic error is particularly difficult to correct. This error originates when the small probe tips are placed close together, as required to make on-wafer measurements. When the probe tips are close, there is leakage, or cross-talk, between them. The difficulty arises when the network analyzer is calibrated with the probes at one separation, and then the probes are moved to a different separation for the device under test measurement. Since the cross-talk level is relatively high at typical calibration separations, moving the probes can induce dramatic errors into subsequent device under test measurements, particularly if an attempt has been made to correct for the cross-talk. This error can be considered a pseudo-systematic error since the cross-talk errors are static for a given probe separation.

Another problem associated with present day cross-talk correction techniques is that the impedances presented by a device under test must be the similar to those used in the calibration process. This can make measuring an unknown device difficult and increase measurement time while the impedances are determined and matched. If the probes are moved, the problem is further exacerbated as erroneous accounts of the cross-talk occur.

Accordingly, there is a need for an improved apparatus and technique for correcting pseudo-systematic errors in a measurement system. Such an apparatus and technique would be of benefit in a network analyzer system utilizing probes.

2

DETAILED DESCRIPTION OF THE PREFERRED EMBODIMENT

In accordance with the present invention, an apparatus and technique for correcting pseudo-systematic errors in a measurement system will be disclosed herein. The measurement system preferably comprises a network analyzer test system employing measurement probes, and the pseudo-systematic errors are those associated with probe tip cross-talk. First, however, a full description of a prior art network analyzer error model is useful.

Figure 1:
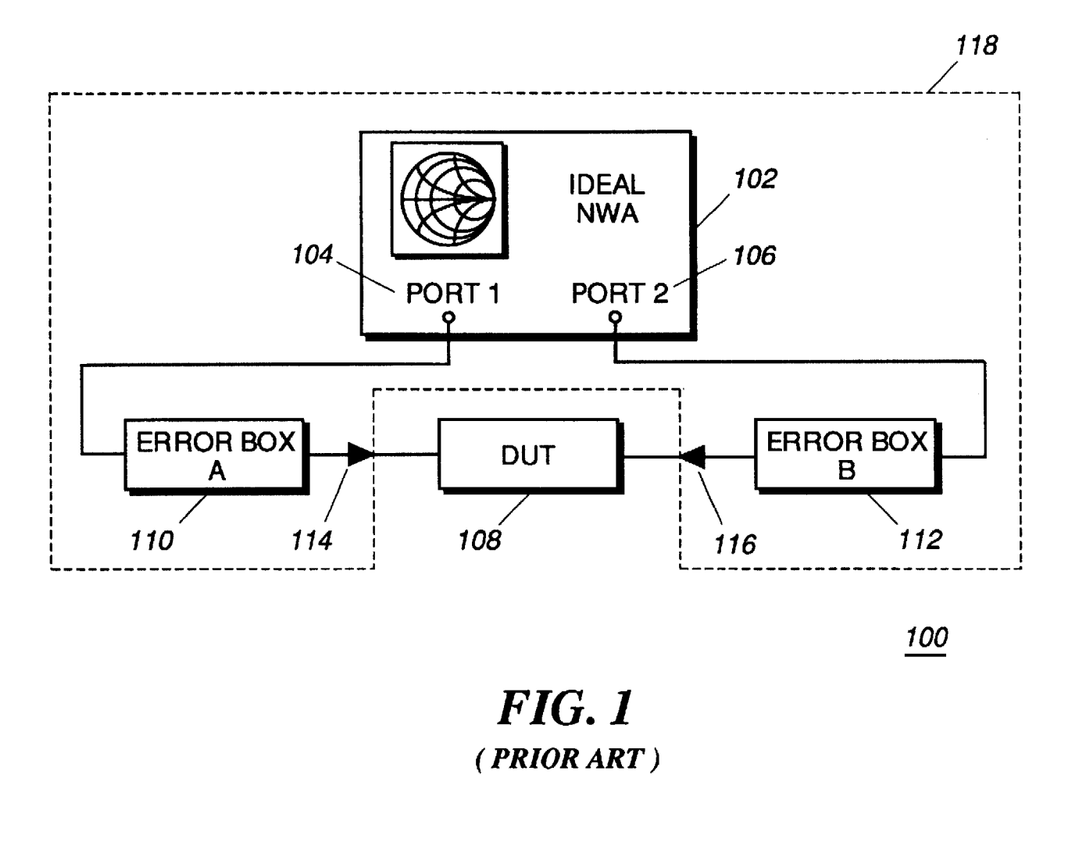
FIG. 1 is a prior art error model for a two-port network analyzer system.

FIG. 1 shows a prior art error model 100 for a two-port network analyzer system. Included within the model 100 are: an "ideal" network analyzer 102 having first and second ports 104, 106, first and second measurement probes 114, 116, a device under test 108, such as a calibration standard or a device on a wafer, and first and second error boxes 110, 112. Error boxes 110, 112 represent the errors associated with a non-ideal network analyzer as depicted by phantom line 118. Error boxes 110, 112 can be viewed as a mathematical network description to represent the errors for the non-ideal network analyzer 118. There are four error terms associated with each mathematical network for this non-ideal two-port network analyzer 118. These error terms can be expressed in matrix form as:

$$E = \begin{bmatrix} e_{11} & 0 & | & e_{13} & 0 \\ 0 & e_{22} & | & 0 & e_{24} \\ \cdots & \cdots & | & \cdots & \cdots \\ e_{31} & 0 & | & e_{33} & 0 \\ 0 & e_{42} & | & 0 & e_{44} \end{bmatrix} \quad (1)$$

Hence, a total of eight parameters are associated with the prior art error model 100. Model 100, however, neglects to account for any cross-talk between the probes 114, 116.

Figure 2:
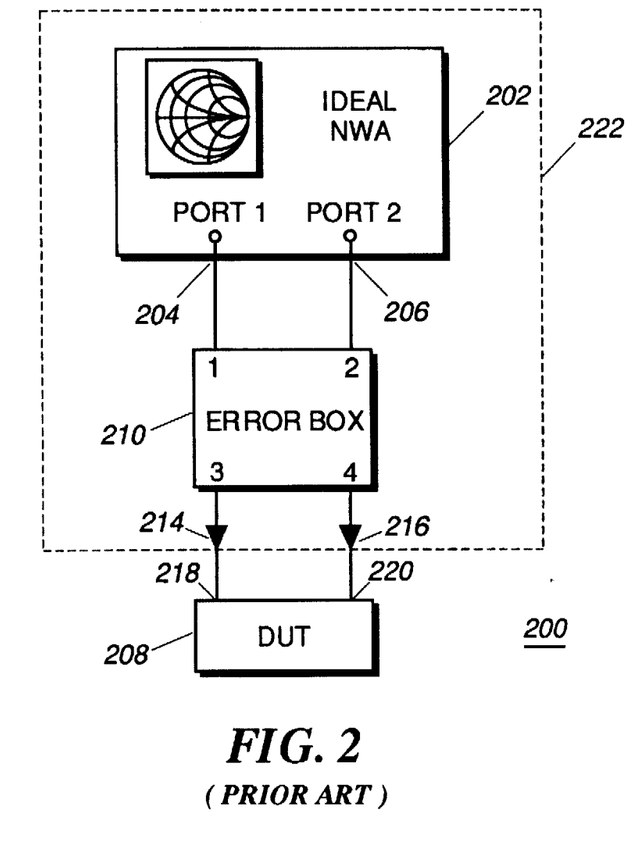
FIG. 2 is another prior art error model for a two-port network analyzer system.

To account for the cross-talk between probes a more complete model must be used. FIG. 2 shows another prior art error model 200 for a two-port network analyzer system. Model 200 includes an "ideal" network analyzer 202 having first and second ports 204, 206, first and second measurement probes 214, 216, a device under test (DUT) 208, such as a calibration standard or a device on a wafer, and a single error box 210. Error box 210 is coupled between the two ports 204, 206 of the network analyzer 202 and between two ports 218, 220 of the device under test 208. Error box 210 represents the errors associated with a non-ideal network analyzer as depicted by phantom line 222. Error box 210 can be viewed as a mathematical network description that represents all errors including cross-talk errors for the non-ideal network analyzer 222. For the non-ideal two-port network analyzer 222 there are sixteen error terms associated with the mathematical network of error box 210. These sixteen error terms represented in matrix form are:

$$E = \begin{bmatrix} e_{11} & e_{12} & | & e_{13} & e_{14} \\ e_{21} & e_{22} & | & e_{23} & e_{24} \\ \cdots & \cdots & | & \cdots & \cdots \\ e_{31} & e_{32} & | & e_{33} & e_{34} \\ e_{41} & e_{42} & | & e_{43} & e_{44} \end{bmatrix} \quad (2)$$

Of the sixteen error terms, eight represent cross-talk paths between the probe tips 214, 216 of the network analyzer, $e_{12}$, $e_{14}$, $e_{21}$, $e_{23}$, $e_{32}$, $e_{34}$, $e_{41}$ and $e_{43}$. Today's standard calibration of a network analyzer, however, takes into account only two of the eight cross-talk paths, $e_{34}$ and $e_{43}$. Cross-talk between paths $e_{34}$ and $e_{43}$ are calibrated out of the system while it is assumed that the other six cross-talk paths are zero. However, the probes, at a specific separation, are an integral part of the error box. If the probes are moved, a different error box (i.e. a different set of error term values) results.

Figure 3:
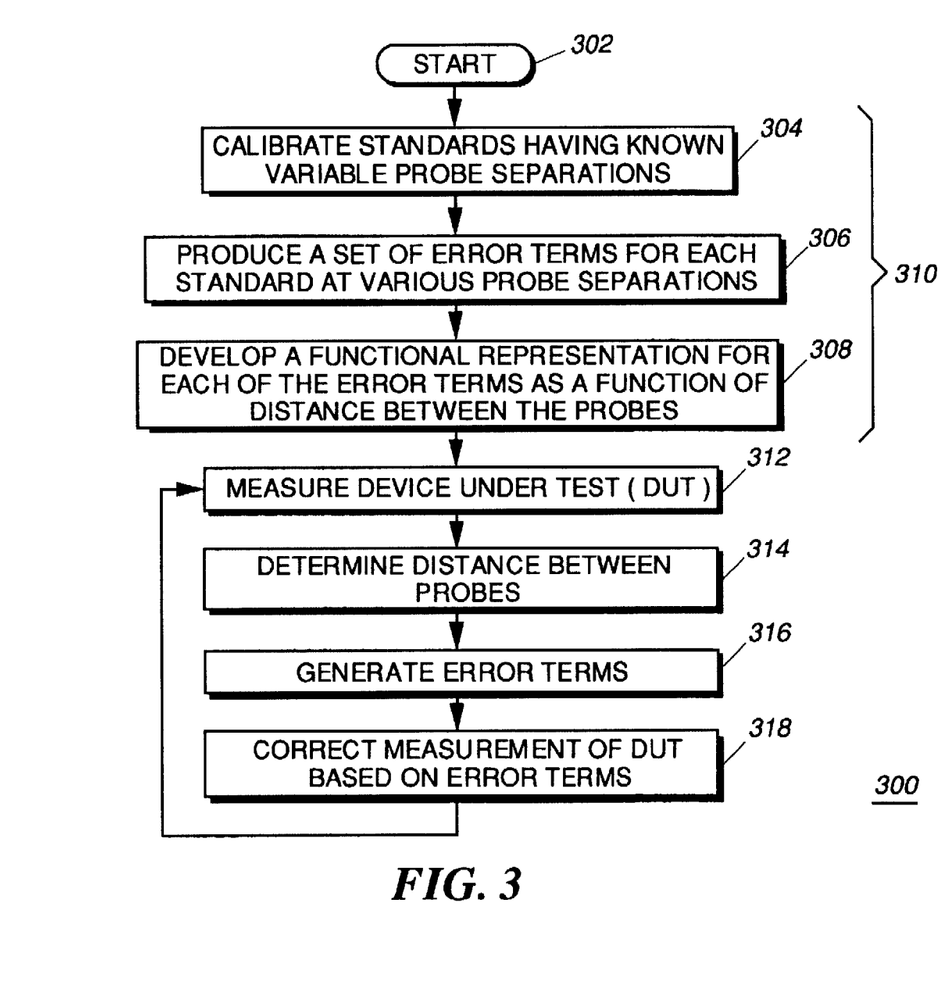
FIG. 3 is a flowchart of a calibration and measurement technique for a network analyzer in accordance with the present invention.

The purpose of the calibration and measurement technique of the present invention is to provide an approximation for all cross-talk parameters between probe tips in a network analyzer system, regardless of the position of the probes. Referring now to FIG. 3, there is shown a flowchart representing a calibration and measurement technique 300 in accordance with the present invention. Steps 304, 306, and 308 provide a calibration technique 310 in accordance with the present invention. The calibration technique begins at step 302 and calibrations are performed on standards (known devices) with known variable probe separations at step 304. The network analyzer produces a set of error terms for each of the standards at various probe separation at step 306. A functional representation for each of the error terms is then developed as a function of distance in step 308. The functional representation developed for each term at step 308 is preferably developed through interpolation techniques which can take a finite set of terms and develop a continuous function. Thus, several continuous functions, one for each error term, are developed to represent each error term as a function of distance. Once calibration is complete, data measurements can now be made on an unknown device using different probe separations with improved accuracy.

The calibration technique 310 described by the invention reduces the problems associated with probe tip cross-talk in calibration. An approximation for all cross-talk parameters between probe tips in a network analyzer system can now be achieved using the calibration technique 310 described by the invention.

Steps 312, 314, 316, and 318 provide a method for measuring an unknown device in a network analyzer calibrated in accordance with the calibration technique 310 of the present invention. The device under test (DUT) is measured at step 312, and the distance between the probes is determined at step 314. The flowchart proceeds to step 316 where a set of error terms are generated based on the determined distance between the probes. In step 316, the distance between the probes is used to derive the error terms from the continuous functions. The measurement of the DUT is then corrected at step 318 based on the error terms generated in step 316. Basically, the step of correcting involves mathematically removing the effects or errors of the "real" or "non-ideal" network analyzer including the effects from probe separation.

In accordance with the present invention, the step of correcting, also referred to as accuracy enhancement or de-embedding, provides an accurate measurement of the DUT by taking into account all of the error terms associated with the network analyzer. In the calibration and measurement technique 300 of the present invention, once the error terms for the probe distance have been determined, a corrected and more accurate measurement for the DUT can be achieved. Other measurements of the DUT can then be performed at different probe separations, if desired, by returning to step 312. These other measurements can be performed without re-calibrating the analyzer, providing a significant advantage over present day calibration and measurement techniques.

Figure 4:
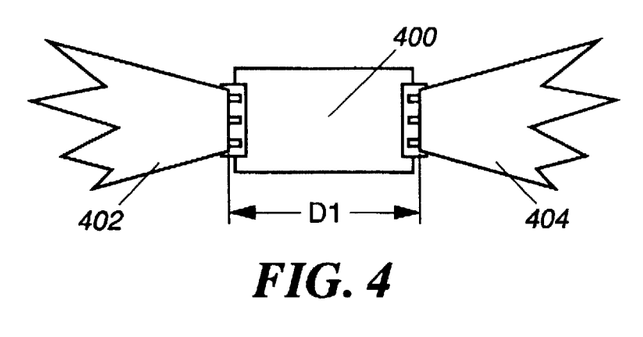
FIG. 4 is an illustration of a pair of probe tips measuring a calibration standard at a first probe separation in accordance with the present invention.
Figure 5:
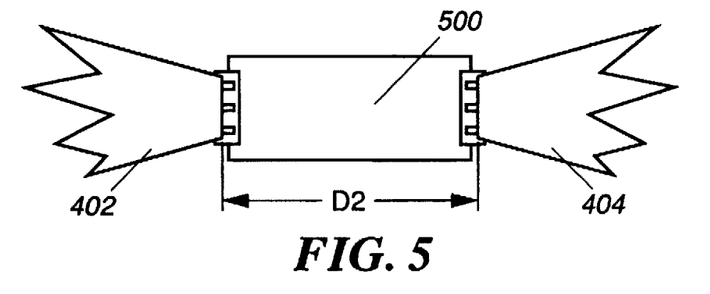
FIG. 5 is an illustration of the pair of probe tips of FIG. 4 measuring a calibration standard at a second probe separation in accordance with the present invention.
Figure 6:
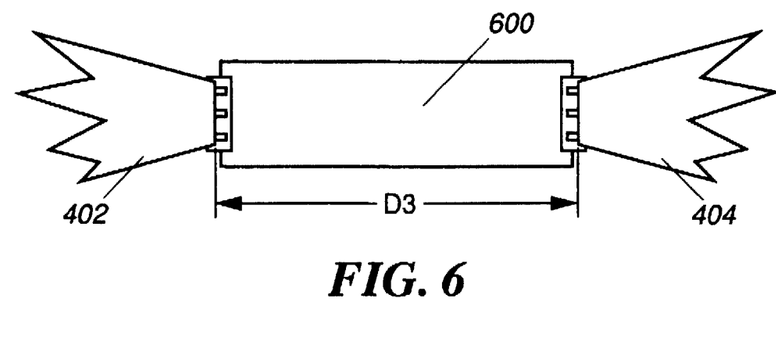
FIG. 6 is an illustration of the pair of probe tips of FIG. 4 measuring a calibration standard at a third probe separation in accordance with the present invention.

Referring now to FIGS. 4, 5, and 6 there are illustrated enlarged views of calibration standards 400, 500, and 600 with varying probe tip separations as part of a network analyzer system in accordance with the present invention. Probe tips 402 and 404 are separated by a distance D1 in FIG. 4, a distance D2 in FIG. 5, and a distance D3 in FIG. 6. A set of standards, for example a set of standards consisting of an open, a short, a thru, and a load, is measured at each probe separation D1, D2, and D3. In accordance with the present invention, a set of error terms is produced for each set of standards at each probe separation. In accordance with the present invention, the network analyzer then develops continuous functions for each of the error terms as a function of distance.

Various sets of calibration standards, such as thru, reflect, and line standards, as well as open, short, load, and thru standards having varying distance separations can be used during the calibration process of the present invention. For example one set of standards (open, short, load, and thru) could be separated by a distance of 100 micrometers (µm), a second set of standards (open, short, load, and thru) could be separated by 200 µm, and a third set of standards (open, short, load, and thru) could be separated by 300 µm.

Figure 7:
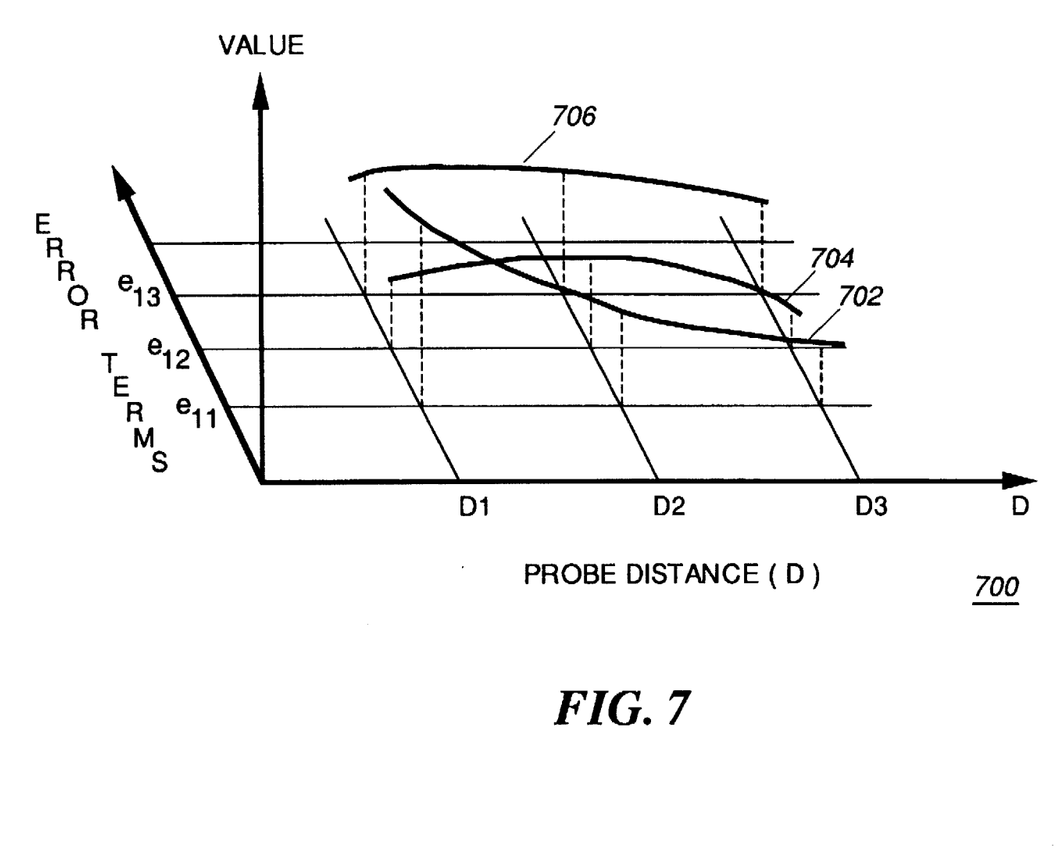
FIG. 7 is a graph representing functional fits for the error terms generated by the standards of FIGS. 4, 5, and 6.

FIG. 7 is a graph representing functional fits for the error terms generated by the standards of FIGS. 4, 5, and 6. Lines identified by designators 702, 704, and 706 represent the continuous functions generated for each error term as a function of distance D1, D2, and D3. The functional fit for each error term can be derived using suitable interpolation techniques, such as a spline interpolation or a linear interpolation, which will produce a continuous function. Spline interpolation is a methodology that takes a set of data points and guarantees that the resulting function will go through every single data point. The varying distances between the probe tips can thus be related by a continuous function.

Figure 8:
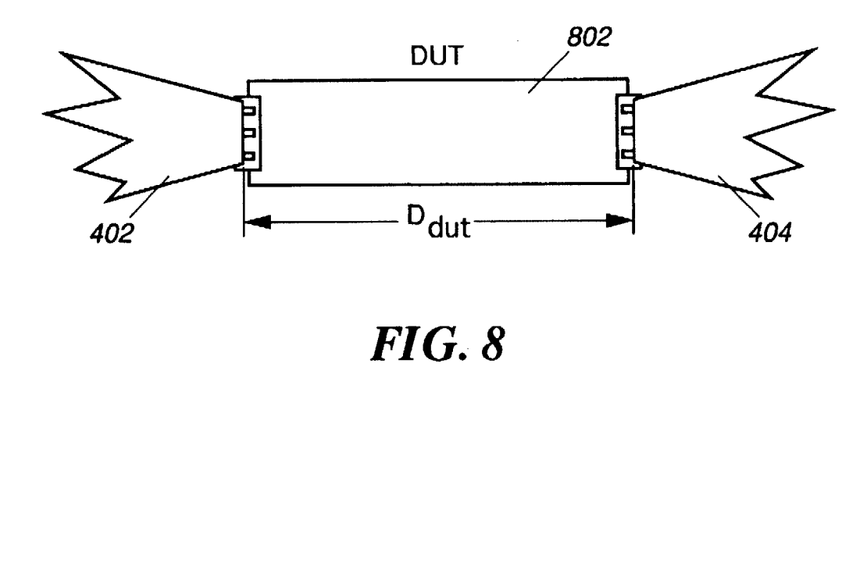
FIG. 8 is an illustration of a unknown device under test being measured with the probe tips of FIG. 4 with a particular probe separation.
Figure 9:
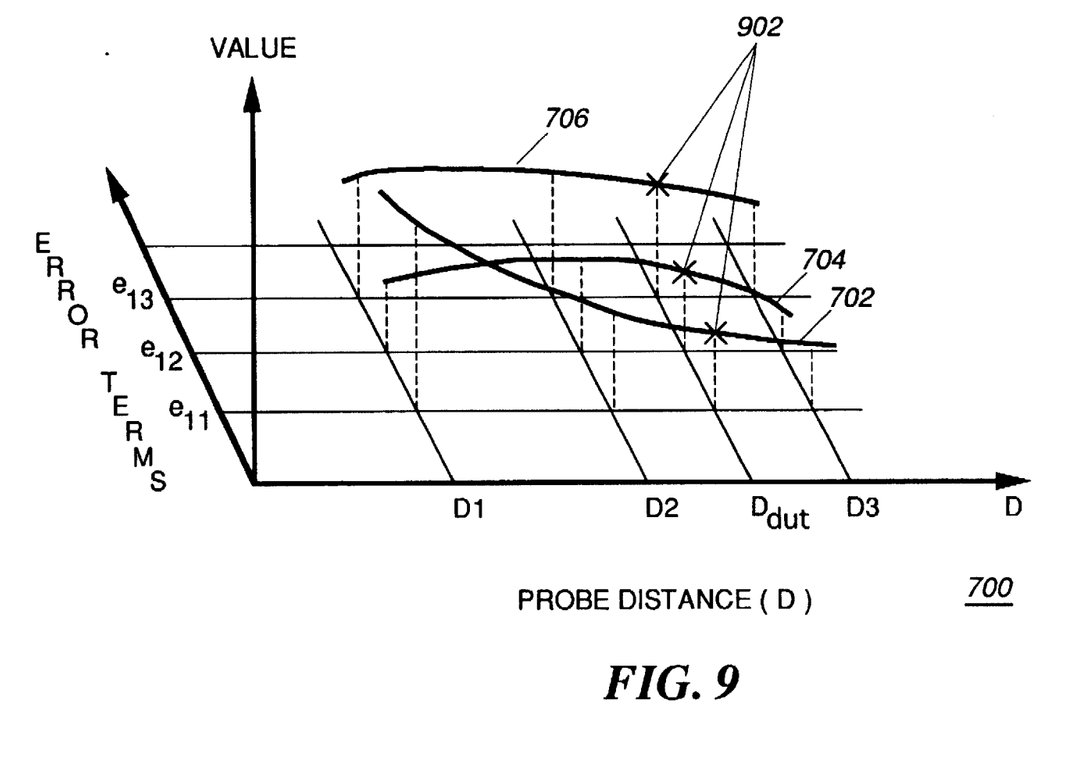
FIG. 9 is a graph relating the distance of the probe separation in FIG. 8 to the functional fits illustrated in the graph of FIG. 7.

FIG. 8 shows probes 402, 404 measuring an unknown device under test (DUT) 802 with a probe separation of $D_{dut}$ in accordance with the present invention. Once the distance between the probes is known, this distance is related back to the continuous functions in the graph of FIG. 7 so that an appropriate set of error terms can be generated. These error terms are then used to correct the measurement of the DUT and provide a more accurate measurement. FIG. 9 illustrates how the known distance, $D_{dut}$, relates back to the continuous functions 702, 704, and 706 of FIG. 7 where an appropriate set of errors terms, indicated by designator 902, is generated.

Hence, the calibration technique described by the invention provides the proper combination of a set of calibrations done at different probe separations. This technique takes calibration at different, known separations of probes, solving for the error terms at each separation. During the DUT correction, the probe separation must be known or determined and given as a parameter of the measurement. The calibration and measurement technique described by the invention provides improved accuracy of on-wafer measurements for devices having port-to-port cross-talk. While shown and described using probe tips other interface devices, such as coaxial cables, antenna, or other suitable interface devices can be used to operatively couple the device under test to the network analyzer.

The network analyzer system of the present invention can determine the distance between the probes using a variety of techniques. The coordinates of the probe locations can be tracked internally by the analyzer such that the probe separation is stored for each calibration. The interpolation of the error terms to provide a functional fit for each term can be accomplished using internal micro-computers resident in the analyzer. The probe separation used for measuring the device under test can then be related to the functional fits and appropriate error terms generated.

Alternatively, the calibration standards of the present invention can be labeled or scribed with their respective probe distances and these values can be entered manually into the network analyzer. The network analyzer then determines a continuous function for each error term based on probe separation. The distance between the probes on a device under test is then determined and entered manually into the network analyzer. Based on the distance between the probes, an appropriate set of error terms is generated with which to correct the measurement of the device under test.

A network analyzer employing the calibration and measurement technique described by the present invention can provide for an approximation of all eight cross-talk error terms described in the two port network analyzer error model of FIG. 2. For the model shown in FIG. 2, a set of 16 error terms is produced for every calibration at every probe distance. Each of these error terms is then interpolated, or fit, into continuous functions. For example, a spline interpolation or linear interpolation for each error term can be developed to provide a continuous function of distance. Unknown devices can then be measured at various probe separations and corrected based on the distance between the probes to provide a more accurate measurement.

Figure 10:
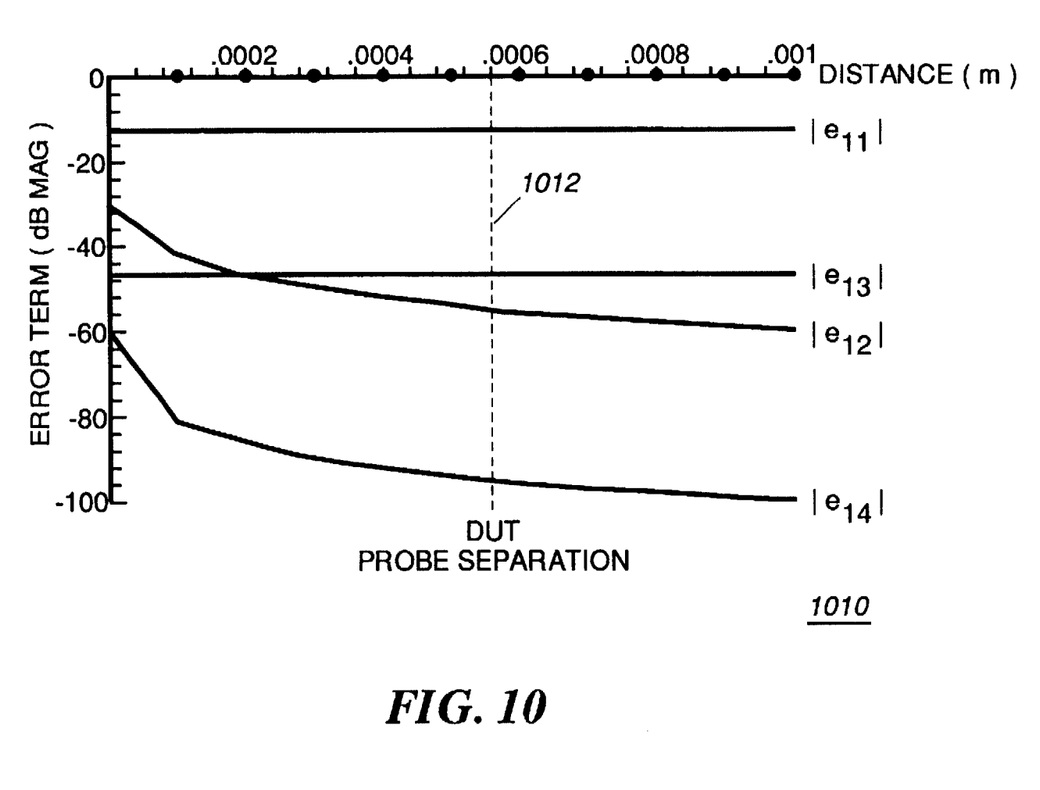
FIG. 10 is a graph showing a simulation of error terms for magnitude as a function of distance.
Figure 11:
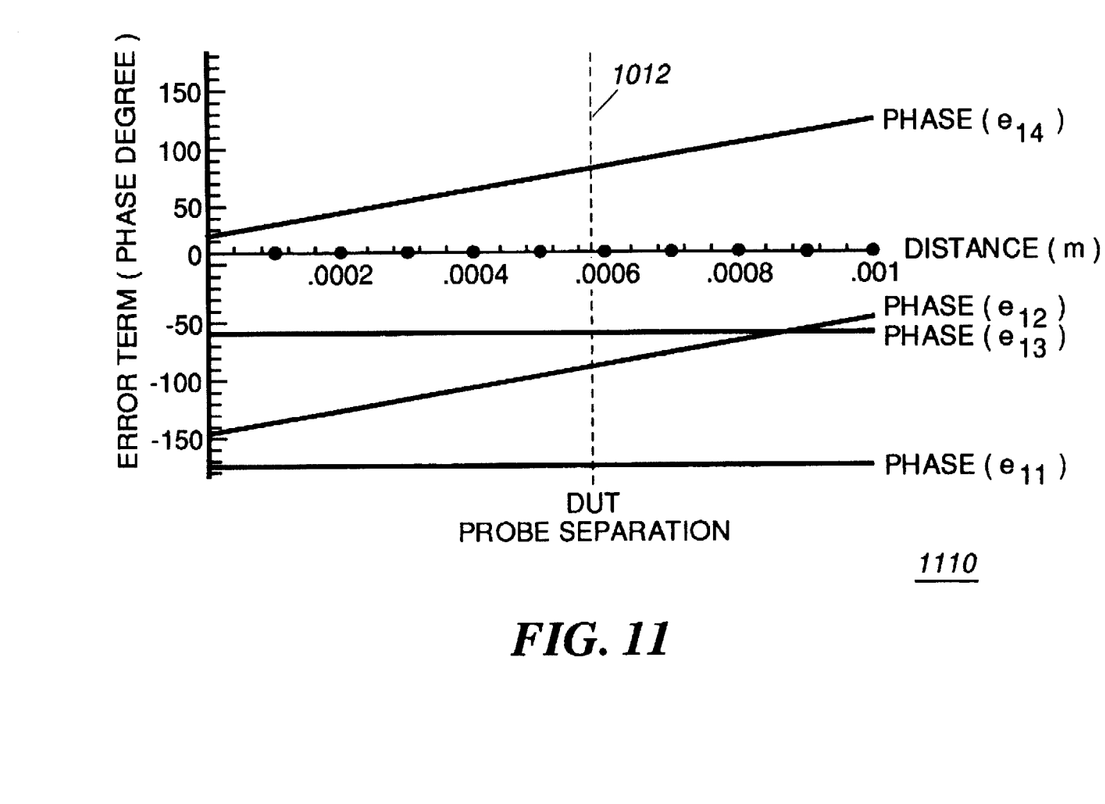
FIG. 11 is a graph showing a simulation of error terms of phase as a function of distance.

A simulation of the calibration and measurement technique described by the invention was performed for the two port network analyzer error model of FIG. 2. Measured S-parameter data was calculated through the postulation of error terms at various distances. A calibration was then completed at each distance using these calculated measured S-parameters. This calibration produced a set of calculated error terms at each distance. All calculated error terms were then approximated with a spline interpolation as a function of distance. Some of these error terms are shown in FIGS. 10 and 11 of the accompanying drawings. Graph 1010 of FIG. 10 shows the magnitude and graph 1110 of FIG. 11 shows the phase of error terms $e_{11}$, $e_{12}$, $e_{13}$, and $e_{14}$ as a function of distance.

Similarly, a set of DUT S-parameters ($S_{ap(DUT)}$) were postulated with a probe separation of 560 μm:

$$S_{ap(DUT)} \text{ (dB)} = \begin{bmatrix} -18.0626 & -41.5561 \\ -43.7167 & -9.76129 \end{bmatrix}$$

Measured DUT S-parameters were simulated and then corrected with interpolated error terms at 560 μm. These interpolated error terms are shown on graphs 1010 and 1110 by designator 1012. The vector error magnitudes between the corrected DUT S-parameters and the original postulated DUT S-parameters in (dB) are:

$$\text{ERROR (dB)} = \begin{bmatrix} -93.325 & -62.4406 \\ -55.7446 & -88.0877 \end{bmatrix}$$

The errors introduced by the interpolation are substantially lower than the magnitudes of the DUT S-parameters. The accuracy of measurement is thus enhanced by accounting for all of the error terms during the calibration and measurement process.

In summary, by taking multiple calibrations at differing probe separations to come up with a set of error terms for each of the separations improved calibration of a network analyzer system is achieved. For every calibration performed at a different probe separation, a different set of error terms is produced. Functional fits of the error terms based on probe separation are then generated to provide continuous functions. Measurements can now be made with various known or determined probe separations on unknown devices, and an appropriate set of error terms can be generated to correct and compensate for the cross-talk between the probes.

Additionally, a network analyzer using the calibration and measurement technique described by the invention is not limited to two port analyzers. For every "n" ports on a network analyzer there are "2n×2n" error terms. For example, if a four port analyzer were to exist, the error box would have 64 error terms. So, for each calibration measurement done at varying probe distances a new set of 64 error terms is generated. In accordance with the present invention, all of these error terms can be fit to continuous functions. A measurement can then be made on an unknown DUT and the effects of errors in the measurement can be corrected. The distances between the probes must be known or determined in order to apply the continuous functions to the measured data of the DUT. Accordingly, the calibration and measurement technique described by the invention has the advantage of being applicable to multi-port analyzers. A more accurate measurement of the DUT is achieved regardless of the number of ports on the network analyzer.

The calibration and measurement technique described by the invention is not limited to 50 ohm systems but provides the benefits of being applicable to any reference impedance. A network analyzer system employing the calibration and measurement technique described by the invention allows an unknown device having differing port impedances to those used during the calibration process to be measured accurately, even if the probe tip separation is varied. Thus, measurements at various probe separations can be made on a device under test without having to recalibrate the analyzer. Accurate cross-talk correction of measurements with non-matched ports can now be achieved. Test time of an unknown device is greatly reduced as there is no longer a need to provide similar port impedances to the analyzer. Increased flexibility in the measurements of devices as well as improved measurement accuracy are among the many benefits associated with a network analyzer system employing the calibration and measurement technique described by the invention.

The calibration and measurement technique described by the invention is applicable to a wide range of measurement applications. For example, the measurement of reverse isolation of a highly unilateral amplifier would be an ideal application. High density integrated circuits having several test points would also benefit from a network analyzer test system employing the calibration technique described by the invention.

While the preferred embodiments of the invention have been illustrated and described, it will be clear that the invention is not so limited. The calibration and measurement technique described by the invention is also applicable to other measurement systems that generate error terms. For example, capacitance meters, which are measurement devices which use probes to determine capacitances on wafers, can also benefit from the calibration and measurement technique of the invention which takes into account the movement of the probes in the measurement of a device.

Numerous modifications, changes, variations, substitutions, and equivalents will occur to those skilled in the art without departing from the spirit and scope of the present invention as defined by the appended claims.

What is claimed is:

1. A measurement system, including:
   a device under test;
   a measurement device utilizing a plurality of measurement interface devices separated from each other by a viable distance and coupled to the measurement device for making measurements on the device under test; and
   wherein the measurement device provides error correction to the measurements in response to the viable distance separating the measurement interface devices.

2. A network analyzer test system, including:
   a device under test;
   a network analyzer utilizing a plurality of probe tips coupled to the network analyzer, the plurality of probe tips separated from each other by a variable distance for making measurements on the device under test; and
   wherein the network analyzer provides error correction to the measurements in response to the variable distance separating the plurality of probe tips.

3. A network analyzer test system as described in claim 2, wherein the network analyzer has port impedances which represent loads to the device under test, and the device under test has port impedances which represent loads to the network analyzer, the port impedances of the device under test differing from the port impedances of the network analyzer.

4. A method of measuring a device under test on a network analyzer having probe tips separated by a variable distance, comprising the steps of:
   measuring data on the device under test;
   determining the distance between the probe tips;
   generating a plurality of error terms based on the measured distance between the probe tips; and
   correcting the measured data based on the generated plurality of error terms.

5. A method of measuring a device under test on a network analyzer as described in claim 4, wherein the network analyzer has port impedances which represent loads to the device under test, and the device under test has port impedances which represent loads to the network analyzer, the port impedances of the device under test differing from the port impedances of the network analyzer.

6. A method of calibrating a network analyzer having probe tips, comprising the steps of:
   providing a plurality of calibration standards with differing probe tip separations;
   generating a plurality of error terms for the plurality of calibration standards;
   developing mathematical functions describing each of the plurality of error terms as a function of the differing probe tip separations; and
   solving for the plurality of error terms for arbitrary probe tip separations using the mathematical functions.

7. A method of calibrating a network analyzer having probe tips as described in claim 6, wherein the mathematical function describing each of the plurality of error terms comprises a continuous function for each error term as a function of the differing probe tip separations.

8. A method of compensating for probe tip separation in a network analyzer, comprising the steps of:
   calibrating the network analyzer;
   measuring data on a device under test with the network analyzer;
   determining a distance between the probe tips; and
   correcting the measured data of the device under test based on the distance between the probes.

9. A method of compensating for probe tip separation in a network analyzer as described in claim 8, wherein the step of correcting further comprises the steps of:
   generating a set of error terms based on the separation of the probes; and correcting the measured data using the error terms.

10. A method of accounting for probe tip cross-talk in a network analyzer system, comprising the steps of:
    providing a plurality of sets of calibration standards with known probe tip separations for each set;
    calibrating the network analyzer for each set of calibration standards;
    producing a set of error terms for each set of calibration standards; and
    developing a mathematical function for each error term as a function of the known probe tip separations.

11. A method of accounting for probe tip cross-talk in a network analyzer system as described in claim 10, further comprising the steps of:
    measuring data on a device utilizing the probe tips;
    determining a distance between the probe tips; and
    correcting the measured data based on the mathematical function for each error term and the determined distance between the probe tips.

12. A method of accounting for probe tip cross-talk in a network analyzer system as described in claim 11, wherein the step of correcting includes the steps of:
    generating error terms based on the mathematical function and the determined distance between the probe tips; and
    applying the generated error terms to the measured data.

13. A method of accounting for probe tip cross-talk as described in claim 10, wherein the step of developing includes the step of applying a spline interpolation on each of the error terms to develop the mathematical function for each error term as a function of the known probe tip separations.

14. A method of accounting for probe tip cross-talk as described in claim 10, wherein the step of developing includes the step of applying a linear interpolation on each of the error terms to develop the mathematical function for each of the error terms as a function of the various known probe tip separations.

15. A method of measuring a device under test in a network analyzer which utilizes probe tips, comprising the steps of:

calibrating the network analyzer at various known probe tip separations;

producing a set of error terms for each known probe tip separation;

developing a continuous function for each of the error terms as a function of the known probe tip separations;

measuring data on the device under test utilizing the probe tips separated by a first distance;

generating a set of error terms derived from the continuous functions based on the first distance separating the probe tips; and correcting the measured data on the device under test using the set of generated error terms.

16. A method of measuring a device under test in a network analyzer as described in claim 15, further comprising the steps of:

measuring data on the device under test utilizing the probe tips separated by a second distance;

generating a second set of error terms from the continuous functions based on the second distance separating the probe tips; and correcting the measured data on the device under test using the second set of generated error terms.

17. A method of measuring a device under test in a network analyzer as described in claim 15, wherein the step of calibrating includes the step of calibrating the network analyzer using known reference impedances; and wherein the device under test presents impedances differing from the known reference impedances used during the step of calibration.

18. A network analyzer system, including:

a network analyzer having a plurality of ports;

a device under test;

a plurality of probes coupled to the plurality of ports and providing an interface between the device under test and the network analyzer, the network analyzer making measurements on the device under test at variable distances between the probes; and wherein the network analyzer measures the device under test and corrects for the variable distances between the probes.

19. A network analyzer as described in claim 18, wherein the device under test presents a plurality of impedances to the plurality of ports of the network analyzer; and the network analyzer corrects for the variable distances between the probes independently of the plurality of impedances presented to the plurality of ports.

20. A network analyzer test system, including:

a network analyzer having a plurality of ports;

a plurality of probes coupled to the plurality of ports, the plurality of probes being separated from each other by variable distances;

a device under test coupled to the plurality of probes, the network analyzer measuring data on the device under test with a known distance separating the probes; and the network analyzer correcting the measured data based on the known distance separating the probes.

21. A network analyzer test system as described in claim 20, wherein the network analyzer provides a set of error terms in response to the known distance separating the plurality of probes.

22. A network analyzer test system, including:

a network analyzer having a plurality of ports;

a device under test;

a plurality of interface devices operatively coupling the device under test to the plurality of ports, the plurality of interface devices being separated from each other by variable distances; and the network analyzer measuring data on the device under test and correcting the data in response to the variable distances separating the plurality of interface devices.

23. A network analyzer test system as described in claim 22, wherein the interface devices comprise antennas.

24. A network analyzer test system as described in claim 22, wherein the interface devices comprise coaxial cables.

25. A network analyzer system, comprising:

a network analyzer having a plurality of ports;

probes coupled to the plurality of ports and providing an interface to a device under test; and the network analyzer taking measurements at various probe separations and producing a set of error terms in response to each of the various probe separations for correcting the measurement of the device under test.

26. A method of measuring a device under test using a network analyzer having movable probe tips, comprising the steps of:

calibrating the network analyzer using standards with various known probe tip separations;

developing continuous functions based on the known probe tip separations;

measuring data on the device at a known probe tip separation differing from those used in the step of calibrating; and correcting the data based on the continuous functions and the known probe tip separation.

* * * * *

UNITED STATES PATENT AND TRADEMARK OFFICE
CERTIFICATE OF CORRECTION

PATENT NO. : 5,734,268
DATED : March 31, 1998
INVENTOR(S) : David E. Bockelman

It is certified that error appears in the above-identified patent and that said Letters Patent is hereby corrected as shown below:

Title page, item [54] and col. 1, in the title, delete "Measurment" and insert therefor --Measurement--.

Column 7, line 28, delete "viable" and insert therefor --variable--.

Signed and Sealed this

Sixth Day of April, 1999

Attest:

Attesting Officer

Q. TODD DICKINSON

Acting Commissioner of Patents and Trademarks